(12) United States Patent
Han (10) Patent No.: US 10,522,221 B2
(45) Date of Patent: Dec. 31, 2019

(54) STORAGE ARRAY PROGRAMMING METHOD AND DEVICE FOR RESISTIVE RANDOM ACCESS MEMORY

(71) Applicant: XI'AN UNIIC SEMICONDUCTORS CO., LTD., Shaanxi (CN)

(72) Inventor: Xiaowei Han, Shaanxi (CN)

(73) Assignee: XI'AN UNIIC SEMICONDUCTORS CO., LTD., Shaanxi (CN)

( * ) Notice: Subject to any disclaimer, the term of this patent is extended or adjusted under 35 U.S.C. 154(b) by 99 days.

(21) Appl. No.: 15/515,359

(22) PCT Filed: Sep. 25, 2015

(86) PCT No.: PCT/CN2015/090690
§ 371 (c)(1),
(2) Date: Jul. 5, 2017

(87) PCT Pub. No.: WO2016/050170
PCT Pub. Date: Apr. 7, 2016

(65) Prior Publication Data
US 2017/0301399 A1 Oct. 19, 2017

(30) Foreign Application Priority Data
Sep. 30, 2014 (CN) .......................... 2014 1 0521542

(51) Int. Cl.
*G11C 11/00* (2006.01)
*G11C 13/00* (2006.01)

(52) U.S. Cl.
CPC ........ *G11C 13/0069* (2013.01); *G11C 13/004* (2013.01); *G11C 13/0064* (2013.01); *G11C 13/0097* (2013.01)

(58) Field of Classification Search
CPC ........ G11C 13/0069; G11C 2013/0092; G11C 13/0061; G11C 2013/009;
(Continued)

(56) References Cited

U.S. PATENT DOCUMENTS 7,450,432 B2 * 11/2008 Wang .................. G11C 11/5628
365/185.03
8,116,127 B2 * 2/2012 Cho ........................ G11C 8/10
365/158
(Continued)

FOREIGN PATENT DOCUMENTS

CN 101231888 A 7/2008
CN 101266834 A 9/2008
(Continued)

OTHER PUBLICATIONS

U.S. Appl. No. 15/563,014, filed Sep. 29, 2017, Xiaowei Han (Xi'an Uniic Semiconductors Co., Ltd.)
(Continued)

*Primary Examiner* — Hien N Nguyen
(74) *Attorney, Agent, or Firm* — Ballard Spahr LLP (57) ABSTRACT

A storage array programming method and device for a resistive random access memory (RAM) are proposed. The resistive RAM comprising a storage array, the storage array comprising a group of storage units to which data is to be written. The programming method comprises: reading the currently stored data in the group of storage units and comparing bit by bit the currently stored data with the data to be written to determine whether the currently stored data is consistent with the data to be written, and generating a data write state according to the determination result; determining the data write state, and by a set operation or a reset operation, writing the data to be written only to the storage units where the currently stored data is inconsistent with the data to be written; checking whether any storage unit having a write failure exists during the set operation or the reset operation; if so, then repeating the previous steps until the writing is completed. The programming method can avoid repetitive writing, thus not only reducing write interference
(Continued)

with a unit to improve writing efficiency of the unit, but also reducing power consumption of writing.

5 Claims, 3 Drawing Sheets

(58) Field of Classification Search
CPC ........ G11C 2029/1202; G11C 2213/72; G11C 29/1201; G11C 11/4076; G11C 7/14; G11C 11/1673
See application file for complete search history.

(56) References Cited

U.S. PATENT DOCUMENTS

| | | |
|---|---|---|
| 2006/0028889 A1 | 2/2006 | Liaw |
| 2006/0209585 A1 | 9/2006 | Tanizaki et al. |
| 2008/0055971 A1 | 3/2008 | Kim et al. |
| 2009/0027953 A1 | 1/2009 | Kang et al. |
| 2010/0067281 A1 | 3/2010 | Xi et al. |
| 2010/0162068 A1* | 6/2010 | Toda ............... G06F 11/1048 714/747 |
| 2011/0261616 A1 | 10/2011 | Kim |
| 2011/0317480 A1* | 12/2011 | Lung ............... G11C 11/5678 365/163 |
| 2013/0103883 A1 | 4/2013 | Kim |
| 2014/0198581 A1 | 7/2014 | Kim et al. |
| 2014/0204652 A1 | 7/2014 | Lee et al. |
| 2015/0187393 A1 | 7/2015 | Ueda et al. |

FOREIGN PATENT DOCUMENTS

| | | |
|---|---|---|
| CN | 101354916 A | 1/2009 |
| CN | 101388246 A | 3/2009 |
| CN | 101404179 | 4/2009 |
| CN | 102870159 A | 1/2013 |
| CN | 103065682 A | 4/2013 |
| CN | 104318956 A | 1/2015 |
| CN | 201510144347.8 | 3/2015 |
| CN | 104733047 A | 6/2015 |
| CN | 204680387 U | 9/2015 |
| JP | 2007/052558 A | 3/2007 |
| WO | PCT/CN2016/072176 | 1/2016 |
| WO | WO-2014/068961 A1 | 9/2016 |
| WO | WO-2016/155410 A1 | 10/2016 |

OTHER PUBLICATIONS

International Search Report and Written Opinion were dated Dec. 25, 2015, by the International Searching Authority for International Application No. PCT/CN2015/090690, which was filed on Sep. 29, 2015 and published as WO 2016/050170 on Apr. 7, 2016 (Applicant—Xi'an Uniic Semiconductors Co., Ltd.) (Original—8 pages // Translation—8 pages).

International Preliminary Report on Patentability was dated Apr. 4, 2017, by the International Searching Authority for International Application No. PCT/CN2015/090690, which was filed on Sep. 29, 2015 and published as WO 2016/050170 on Apr. 7, 2016 (Applicant—Xi'an Uniic Semiconductors Co., Ltd.)(Original—5 pages).

International Search Report was dated Apr. 26, 2016 by the International Searching Authority for International Application No. PCT/CN2016/072176, which was filed on Jan. 26, 2016 and published as WO 2016/155410-A1 on Oct. 6, 2016 (Applicant—Xi'an Uniic Semiconductors Co., Ltd.) (Original—5 pages // Translated—3 pages).

* cited by examiner

STORAGE ARRAY PROGRAMMING METHOD AND DEVICE FOR RESISTIVE RANDOM ACCESS MEMORY

CROSS-REFERENCE TO RELATED APPLICATIONS

The present application is a U.S. National Phase Application of International Application No. PCT/CN2015/090690, filed Sep. 25, 2015, which claims priority to Chinese Application No. 201410521542.3, filed Sep. 30, 2014, each of which are hereby incorporated by reference in their entirety.

TECHNICAL FIELD

The present invention relates to a storage array programming method and device for a resistive random access memory.

BACKGROUND ART

With the development of memory technology, there is an increasing need for small-sized memories with higher density and performance. Nevertheless, flash memories require complex mask patterns and exorbitant manufacturing costs and are subjected to relatively large word line leakage and crosstalk between cells. In addition, as the number of electrons in floating gates becomes smaller and smaller, the size reduction capacity of the flash memories is greatly limited and it is estimated that the development of the size reduction capacity will be difficult to continue when it gets to 1z nm. Thus, emerging non-volatile memories such as CBRAM, MRAM, PRAM and RRAM gain increasing attention, wherein resistive random access memory RRAM, by virtue of high speed, large capacity, low power consumption, low cost and high reliability, is regarded as the most powerful candidate for flash memories.

Nevertheless, as a RRAM unit changes resistance states ("1" for a low resistance state, "0" for a high resistance state) according to voltage or current applied on two ends thereof, the resistance in a low resistance state and a high resistance state is very sensitive to the applied voltage or current. In the prior art, when a group of RRAM units are programmed, over-set will be generated to cause the failure of a high resistance state if the units that have been in a low resistance state are subjected to a positive voltage and are set again; or over-reset will be generated to cause the failure of a low resistance state if the units that have been in a high resistance state are subjected to a negative voltage and are reset again. The programming method described above will cause the failure of a high resistance state or a low resistance state of storage units, thereby reducing the data storage capacity and the service life of the storage units.

Thus, a programming method and device that can solve at least one of the above-mentioned problems are urgently demanded.

CONTENTS OF THE INVENTION

In one aspect, the present invention provides a storage array programming method for a resistive random access memory, the resistive random access memory comprising a storage array, the storage array comprising a group of storage units to which data is to be written, characterized in that, the programming method comprising the following steps:

(i) reading the currently stored data in the group of storage units and comparing bit by bit the currently stored data with the data to be written to determine whether the currently stored data are consistent with the data to be written, and generating a data write state according to the determination result.

(ii) determining the data write state, and by a set operation or a reset operation, writing the data to be written only to the storage units where the currently stored data are inconsistent with the data to be written; and (iii) checking whether any storage unit having a write failure exists during the set operation or the reset operation; if so, then repeating the previous step (ii) until the writing is completed.

In another aspect, the present invention provides a storage array programming device for a resistive random access memory, the resistive random access memory comprising a storage array, the storage array comprising a group of storage units to which data is to be written, characterized in that, the storage array programming device comprising:

a read and write circuit for reading the currently stored data in the group of storage units;

a data comparator for comparing bit by bit the currently stored data with the data to be written to determine whether the currently stored data is consistent with the data to be written;

a data write state generation unit, which generates the data write state according to the comparison result of the data comparator;

a reset module, which performs a reset operation only on the storage units to be reset where the currently stored data is inconsistent with the data to be written according to the data write state; and a set module, which performs a set operation only on the storage units to be set where the currently stored data is inconsistent with the data to be written according to the data write state.

The storage array programming method and device for a resistive random access memory of the present invention can avoid repetitive writing, thus not only reducing write interference with the unit to improve service life of the unit, but also reducing power consumption for writing.

In a further aspect, the present invention further provides a storage array programming method for a resistive random access memory, comprising the following steps:

(1) initializing a set-counter scounter and a reset-counter rcounter, which are respectively used for counting the number of voltage pulses applied when a group of storage units in the storage array are subjected to a set operation and the number of voltage pulses applied when a group of storage units in the storage array are subjected to a reset operation, and respectively output signals scnt and rcnt, wherein $0 \leq scnt \leq P-1$, $0 \leq rcnt \leq P-1$, P represents a predefined maximum number of voltage pulses allowed to be applied;

(2) reading the target unit data, and comparing the target unit data with the data to be written, registering comparison results $C[i]$ ($i=0, 1, \ldots, n-1$) of each bit, n is the number of units written simultaneously each time, and generating a data write state WDS according to the comparison result $C[i]$; and (3) according to the data write state WDS, performing a reset or set write operation on the target unit where the data are inconsistent with the data to be written, until if the data write state WDS, within the predefined number P, changes to indicate the target unit data are all consistent with the data to be written, the programming succeeds; if not, the programming fails.

In a further aspect, the present invention further provides a storage array programming device for a resistive random access memory, comprising: a set-counter scounter and a reset-counter rcounter respectively for counting the number of voltage pulses applied during set and reset operations in programming, and respectively output signals scnt and rcnt, wherein $0 \leq scnt \leq P-1$, $0 \leq rcnt \leq P-1$, P represents a predefined maximum number of voltage pulses allowed to be applied; a read and write circuit for reading the data in a target unit; a data comparator for comparing the target unit data with the data to be written; a registering module for registering a comparison result C[i] (i=0, 1, . . . , n−1) of each bit, n is the number of units to be written simultaneously each time; a determining module for generating a data write state WDS according to the comparison result C[i]; a reset module for, according to the data write state WDS, performing a reset write operation on the target unit where the data are inconsistent with the data to be written; and a set module for, according to the data write state WDS, performing a set write operation on the target unit where the data are inconsistent with the data to be written.

The present invention has, over the prior art, the following advantageous technical effects:

The present invention only writes the target units where the stored data are inconsistent with the data to be written by utilizing counters respectively provided for set and reset operations to compare the target unit data and the data to be written. Thus, it can be ensured that only the target units where the stored data are inconsistent with the data to be written are written during programming, avoiding repetitive writing, which can not only reduce write interference with the unit to improve service life of the unit, but also enable, within the limit of a predefined maximum number of voltage pulses allowed to be applied, the improvement in data reading and writing and the reduction of power consumption for writing.

Furthermore, classification is made by defining data write states WDSs. Thus, with respect to different data write states WDSs, situations can be differentially processed in a clear and definite manner, thereby increasing the data write rate and reducing the time of determination and execution.

Moreover, in a reset process, "0"s are only written to the units where "1"s are stored, i.e. the reverse Vreset is only applied to low resistance units where "1"s are currently stored; in a set process, "1"s are only written to the units where "0"s are stored, i.e. the forward Vset is only applied to high resistance units where "0"s are currently stored. Thus, other units are not subjected to write process, thereby not only avoiding write interference, but also prolonging the service life of units.

Additionally, when both of "1"s and "0"s are not all consistent with values to be written, the set or reset operation can be carried out sequentially on the units where "1"s are written and the units where "0"s are written. Thus, on the one hand, it simplifies processing procedures, and on the other hand, it can split the data processing according to idle/busy state of operations, thereby improving the overall processing efficiency and the time of data write.

MODE OF CARRYING OUT THE INVENTION

The embodiments of the present invention will be further described in detail with reference to the figures below. It should be understood that these descriptions are only intended to explain rather than limit the present invention.

The present invention provides a storage array programming method for a resistive random access memory, the resistive random access memory comprising a storage array, the storage array comprising a group of storage units to which data is to be written, the programming method comprising the following steps:

(i) reading the currently stored data in the group of storage units and comparing bit by bit the currently stored data with the data to be written to determine whether the currently stored data are consistent with the data to be written, and generating a data write state according to the determination result;

(ii) determining the data write state, and by a set operation or a reset operation, writing the data to be written only to the storage units where the currently stored data are inconsistent with the data to be written; and (iii) checking whether any storage unit having a write failure exists during the set operation or the reset operation; if so, then repeating the previous step (ii) until the writing is completed.

Preferably, there are four data write states, to respectively indicate whether "0" bits in the data to be written are consistent with corresponding bits in the currently stored data and whether "1" bits in the data to be written are consistent with corresponding bits in the currently stored data.

Preferably, according to different situations indicated by the data write states, the step (ii) comprises the following steps:

A. if the data write state indicates that "0" bits and "1" bits in the data to be written are all consistent with the corresponding bits in the currently stored data, the writing is completed;

B. if the data write state indicates that "1" bits in the data to be written are all consistent with the corresponding bits in the currently stored data, but "0" bits in the data to be written are not all consistent with the corresponding bits in the currently stored data, those inconsistent bits are written as "0" by a reset operation;

C. if the data write state indicates that "0" bits in the data to be written are all consistent with the corresponding bits in the currently stored data, but "1" bit in the data to be written are not all consistent with the corresponding bits in the currently stored data, those inconsistent bits are written as "1" by a set operation; and D. if the data write state indicates that both of "0" bits and "1" bits in the data to be written are not all consistent with the corresponding bits in the currently stored data, either one of the set and reset operations is performed firstly and then the other until the writing is completed.

Preferably, the method further comprises initializing a set-counter and a reset-counter prior to the step (i), which are respectively used for counting the number of voltage pulses applied during the set operation scnt and the number of voltage pulses applied during the reset operation rcnt, wherein $0 \leq scnt \leq P-1$, $0 \leq rcnt \leq P-1$, P represents a predefined maximum number of voltage pulses allowed to be applied.

Preferably, the reset operation comprises the following steps:
determining whether rcnt is equal to P, if so, completing the writing, and if not, calculating a source line reset voltage Vreset=Vrinitial+(rcnt*Vstep), wherein Vrinitial is an initial reset voltage, and Vstep is a step voltage;
then adding 1 to rcnt to obtain rcnt=rcnt+1, and
applying the reverse source line reset voltage to the storage units in a low resistance state to be reset.

Preferably, the step (iii) comprises:
reading the reset storage units after the reset operation and verifying whether the resistance of the storage units R is greater than a high resistance critical value $R_{HRS}$;
updating the data write state according to the comparison result, if R is greater than $R_{HRS}$, updating the data write state such that it indicates that "0" bits in the data to be written are all consistent with the corresponding bits in the currently stored data, and if not, repeating the reset operation until the writing is completed.

Preferably, the set operation comprises the following steps:
determining whether scnt is equal to P, if so, completing the writing, and if not, calculating a bit line set voltage Vset=Vsinitial+(scnt*Vstep), wherein Vsinitial is an initial set voltage, and Vstep is a step voltage;
then adding 1 to scnt to obtain scnt=scnt+1, and applying the forward bit line set voltage to the storage units in a high resistance state to be set.

Preferably, the step (iii) comprises:
reading the set storage units after the set operation and verifying whether the resistance of the storage units R is smaller than a low resistance critical value $R_{LRS}$; and
updating the data write state according to the comparison result, if R is smaller than $R_{LRS}$, updating the data write state such that it indicates that "1" bits in the data to be written are all consistent with the corresponding bits in the currently stored data, and if not, repeating the set operation until the writing is completed.

Preferably, under the situation that the data write state indicates both of "0" bits and "1" bits in the data to be written are not all consistent with the corresponding bits in the currently stored data, i.e. in step D, if a set operation is performed first, "1"s will be written by the set operation to the storage units in a high resistance state to be set; then the data write state will be updated; if the data write state is updated to indicate that "1" bits in the data to be written are all consistent with the corresponding bits in the currently stored data, but "0" bits in the data to be written are not all consistent with the corresponding bits in the currently stored data, a reset operation will be performed, otherwise the set operation will be repeated;

during the reset operation, "0"s are written by the reset operation to the storage units in a low resistance state to be reset; then the data write state is updated; if the data write state is updated to indicate that "0" bits and "1" bits in the data to be written are all consistent with the target unit data, the writing will be completed, otherwise the reset operation will be repeated.

Preferably, different from the aforesaid order, in step D, if the reset operation is performed first, "0"s will be written by the reset operation to the storage units in a low resistance state to be reset; then the data write state will be updated; if the data write state is updated to indicate that "0" bits in the data to be written are all consistent with the corresponding bits in the currently stored data, but "1"s bit in the data to be written are not all consistent with the corresponding bits in the currently stored data, a set operation will be performed, otherwise the reset operation will be repeated;

during the set operation, "1"s will be written by the set operation to the storage units in a high resistance state to be set; then the data write state will be updated; if the data write state is updated to indicate that "0" bits and "1" bits in the data to be written are all consistent with the target unit data, the writing will be completed, otherwise the set operation will be repeated.

Furthermore, the present invention further provides a storage array programming device for a resistive random access memory, the resistive random access memory comprising a storage array, the storage array comprising a group of storage units to which data is to be written, the storage array programming device comprising:
a read and write circuit for reading the currently stored data in the group of storage units;
a data comparator for comparing bit by bit the currently stored data with the data to be written to determine whether the currently stored data are consistent with the data to be written;
a data write state generation unit, which generates the data write state according to the comparison result of the data comparator;
a reset module, which performs a reset operation only on the storage units to be reset where the currently stored data are inconsistent with the data to be written according to the data write state; and
a set module, which performs a set operation only on the storage units to be set where the currently stored data are inconsistent with the data to be written according to the data write state.

Preferably, there are four data write states, to respectively indicate whether "0" bits in the data to be written are consistent with corresponding bits in the currently stored data and whether "1" bits in the data to be written are consistent with corresponding bits in the currently stored data.

Preferably, the reset module comprises:
a reset-counter for counting the number of voltage pulses applied during a reset operation rcnt, rcnt being increased by 1 per repetition of the reset operation, wherein $0 \leq rcnt \leq P-1$, P represents a predefined maximum number of voltage pulses allowed to be applied; and
a reset voltage generator for generating a reset source line voltage Vreset, Vreset=Vrinitial+(rcnt*Vstep), wherein Vrinitial is an initial reset voltage, and Vstep is a step voltage.

Preferably, the set module comprises:
a set-counter for counting the number of voltage pulses applied during a set operation scnt, scnt being increased by 1 per repetition of the set operation, wherein $0 \leq scnt \leq P-1$, P represents a predefined maximum number of voltage pulses allowed to be applied; and
a set voltage generator for generating a set bit line voltage Vset, Vset=Vsinitial+(scnt*Vstep), wherein Vsinitial is an initial set voltage, and Vstep is a step voltage.

Preferably, the read and write circuit is further used for, after the reset operation, reading the reset storage units to verify whether the resistance of the storage units R is greater than a high resistance critical value $R_{HRS}$; or the read and write circuit is further used for, after the set operation, reading the set storage units to verify whether the resistance of the storage units R is smaller than a low resistance critical value $R_{LRS}$.

In a further aspect, the present invention further provides a storage array programming method for a resistive random access memory, comprising the following steps:

(1) initializing a set-counter scounter and a reset-counter rcounter, which are respectively used for counting the number of voltage pulses applied when a group of storage units in the storage array are subjected to a set operation and the number of voltage pulses applied when a group of storage units in the storage array are subjected to a reset operation, and respectively output signals scnt and rcnt, wherein $0 \leq scnt \leq P-1$, $0 \leq rcnt \leq P-1$, P represents a predefined maximum number of voltage pulses allowed to be applied.

(2) reading the target unit data, and comparing the target unit data with the data to be written, registering comparison results C[i] (i=0, 1, . . . , n−1) of each bit, n is the number of units written simultaneously each time, and generating a data write state WDS according to the comparison result C[i]; and (3) according to the data write state WDS, performing a reset or set write operation on the target unit where the data are inconsistent with the data to be written, until if the data write state WDS, within the predefined number P, changes to indicate the data to be written are all consistent with the target unit data, the programming succeeds; if not, the programming fails.

Preferably, in the step (2), there are four data write states WDSs: WDS="11" indicates that the data to be written are all consistent with the target unit data, WDS="10" indicates that "1"s to be written are all consistent with the target unit data, and "0"s to be written are not all consistent with the target unit data, WDS="01" indicates that "0"s to be written are all consistent with the target unit data, and "1"s to be written are not all consistent with the target unit data, and WDS="00" indicates both of "1"s and "0"s to be written are not all consistent with the target unit data.

Preferably, in the step (3), a. if the data write state WDS indicates that the data to be written are all consistent with the target unit data, the programming succeeds;

b. if the data write state WDS indicates that "1"s to be written are all consistent with the target unit data, and "0"s to be written are not all consistent with the target unit data, a reset operation will be performed to reset the units in a low resistance state, and then the data write state will be updated; and if WDS changes to indicate that the data to be written are all consistent with the target unit data, the programming succeeds, otherwise returning to the reset operation to start a cycle;

c. if the data write state WDS indicates that "0"s to be written are all consistent with the target unit data, and "1"s to be written are not all consistent with the target unit data, a set operation will be performed to set the units in a high resistance state, and then the data write state will be updated; and if WDS changes to indicate that the data to be written are all consistent with the target unit data, the programming succeeds, otherwise returning to the set operation to start a cycle; and d. if the data write state WDS indicates that both of "1"s and "0"s to be written are not all consistent with the target unit data, either one of a set or reset operation will be preformed first, and then the other; if WDS, within the predefined number P, changes to indicate that the data to be written are all consistent with the target unit data, the programming succeeds, otherwise the programming fails.

Further, in the step b, when a reset operation is performed, determining whether rcnt is equal to P, if so, the programming fails, and if not, calculating Vreset=Vrinitial+(rcnt*Vstep), meanwhile adding 1 to rcnt to obtain rcnt=rcnt+1 and applying the reverse Vreset to the units in a low resistance state, wherein Vreset is a source line reset voltage, Vrinitial is an initial reset voltage, and Vstep is a step voltage; then reading the reset unit and verifying whether the resistance of the unit R is greater than a high resistance critical value $R_{HRS}$; and updating the data write state according to the comparison result, if R is greater than $R_{HRS}$, updating WDS to indicate that "0"s to be written are all consistent with the target unit data, and if not, returning to a reset operation to start a cycle.

Further, in the step c, when a set operation is performed, determining whether scnt is equal to P, if so, the programming has failed, and if not, calculating Vset=Vsinitial+(scnt*Vstep), meanwhile adding 1 to scnt to obtain scnt=scnt+1 and applying the forward Vset to the units in a high resistance state, wherein Vset is a bit line set voltage, Vsinitial is an initial set voltage, and Vstep is a step voltage; then reading the set unit and verifying whether the resistance of the unit R is smaller than a low resistance critical value $R_{LRS}$; and updating the data write state according to the comparison result, if R is smaller than $R_{LRS}$, updating WDS to indicate that "1"s to be written are all consistent with the target unit data, and if not, returning to a set operation start a cycle.

Further, in the step d, if a set operation is performed first, the set operation as described in the step c will be performed; if WDS, within the predefined number P, changes to indicate that "1"s to be written are all consistent with the target unit data and "0"s to be written are not all consistent with the target unit data, a reset operation will be preformed, otherwise the programming fails; during the reset operation, the reset operation as described in the step b is performed; if WDS, within the predefined number P, changes to indicate that the data to be written are all consistent with the target unit data, the programming succeeds, and if not, the programming fails.

Further, in step d, if a reset operation is performed first, the reset operation as described in the step b will be performed; if WDS, within the predefined number P, changes to indicate that "0"s to be written are all consistent with the target unit data and the "1"s to be written are not all consistent with the target unit data, a set operation will be preformed, otherwise the programming fails; during the set operation, the set operation as described in the step c is performed; if WDS, within the predefined number P, changes to indicate that the data to be written are all consistent with the target unit data, the programming succeeds, and if not, the programming fails.

In another aspect, the present invention further provides a storage array programming device for a resistive random access memory, comprising: a set-counter scounter and a reset-counter rcounter respectively for counting the number of voltage pulses applied during set and reset operations in programming, and respectively output signals scnt and rcnt, wherein $0 \leq scnt \leq P-1$, $0 \leq rcnt \leq P-1$, P represents a predefined maximum number of voltage pulses allowed to be applied; a read and write circuit for reading the data in a target unit;

a data comparator for comparing the target unit data with the data to be written; a registering module for registering a comparison result C[i] (i=0, 1, . . . , n−1) of each bit, n is the number of units to be written simultaneously each time; a determining module for generating a data write state WDS according to the comparison result C[i]; a reset module for, according to the data write state WDS, performing a reset write operation on the target unit where the data are inconsistent with the data to be written; and a set module for, according to the data write state WDS, performing a set write operation on the target unit where the data are inconsistent with the data to be written.

Preferably, the reset module comprises: a module for determining whether scnt=P; a module for calculating Vreset=Vsinitial+(rcnt*Vstep) and rcnt=rcnt+1 when rcnt is not equal to P; a reset voltage generator for applying the reverse Vreset to the units in a low resistance state; a module for reading a reset unit and verifying whether the resistance of the unit is higher than a high resistance critical value; and a module for updating the data write state according to the verification result.

Preferably, the set module comprises: a module for determining whether scnt=p; a module for calculating Vset=Vsinitial+(scnt*Vstep) and scnt=scnt+1 when scnt is not equal to P; a set voltage generator for applying the forward Vset to the units in a high resistance state; a module for reading a set unit and verifying whether the resistance of the unit is smaller than a low resistance critical value; and a module for updating the data write state according to the verification result.

The present invention will be described below by taking a storage array consisting of 1T1R (1 transistor and 1 resistor) type RRAM storage units as an example. The present invention is also applicable to a storage array consisting of 1R (1 resistor) type storage units and a storage array consisting of 1D1R (1diode 1 resistor) type storage units.

Figure 1:
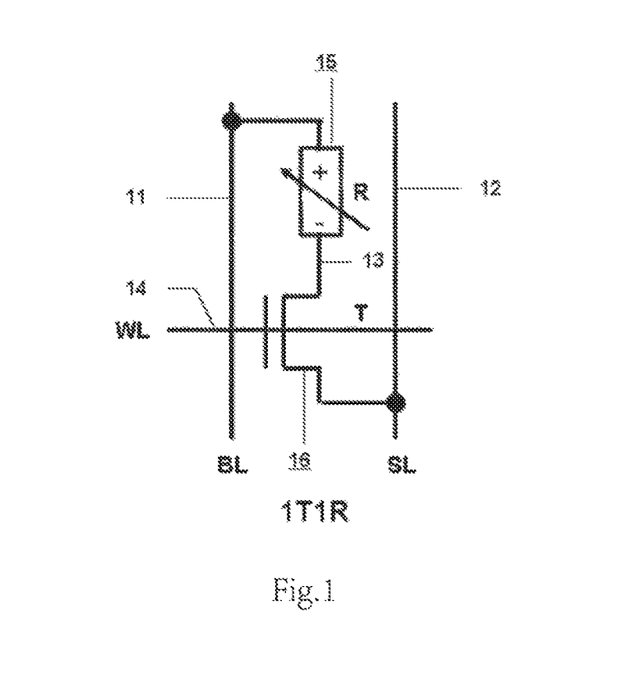
FIG. 1 is a schematic diagram of the structure of a 1T1R storage unit in a resistive random access memory in the prior art.

FIG. 1 is a schematic diagram of the structure of 1T1R storage units in a resistive random access memory in the prior art.

As shown in FIG. 1, a 1T1R RRAM storage unit comprises a resistive unit 15 and a NMOS select transistor 16. WL is word line, BL is bit line, and SL is source line. An anode of the resistive unit 15 is connected to a bit line 11, and a cathode of the resistive unit 15 is connected to a drain terminal 13 of the NMOS select transistor 16, a source terminal of the NMOS select transistor 16 is connected to a source line 12, and a gate terminal of the NMOS select transistor 16 is connected to a word line 14. When the resistive unit 15 is in a low resistance state, the value stored in IT1R is '1', and when the resistive unit 15 is in a high resistance state, the value stored in IT1R is '0'.

When reading and writing operations are performed on the IT1R RRAM storage unit, the operation conditions are as shown in Table 1.

TABLE 1

| 1T1R  | set      | reset     | read |
|-------|----------|-----------|------|
| WL    | Vset_wl  | Vreset_wl | VDD  |
| BL    | Vset     | 0         | Vread|
| SL    | 0        | Vreset    | 0    |
| state | LRS(1)   | HRS(0)    | 1/0  |

In Table 1, set is an operation in which R changes from a high resistance state to a low resistance state; reset is a operation in which R changes from a low resistance state to a high resistance state; Vset_wl is word line set voltage; Vreset_wl is word line reset voltage; VDD is power supply voltage; Vset is bit line set voltage; Vreset is source line reset voltage; Vread is bit line read voltage; LRS (1) is low resistance state and represents data "1"; HRS(0) is high resistance state and represents data "0".

When '1' is written to 1T1R, i.e. when setting the resistive unit 15, the word line 14 is connected to voltage Vset_wl, the bit line 11 is connected to bit line set voltage Vset and the source line 12 is connected to ground line GND. When '0' is written to 1T1R, i.e. when resetting the resistive unit 15, the word line 14 is connected to voltage Vreset_wl, the bit line 11 is connected to ground line GND, and the source line 12 is connected to source line reset voltage Vreset. When IT1R is read, the word line 14 is connected to power supply voltage VDD, the bit line 11 is connected to bit line read voltage Vread, and the source line 12 is connected to ground line. The bit line 11 current and a reference current are sent to a current-based sensitive amplifier. If the bit line 11 current is greater than the reference current, the read value is "1", otherwise the read value is "0".

Figure 2:
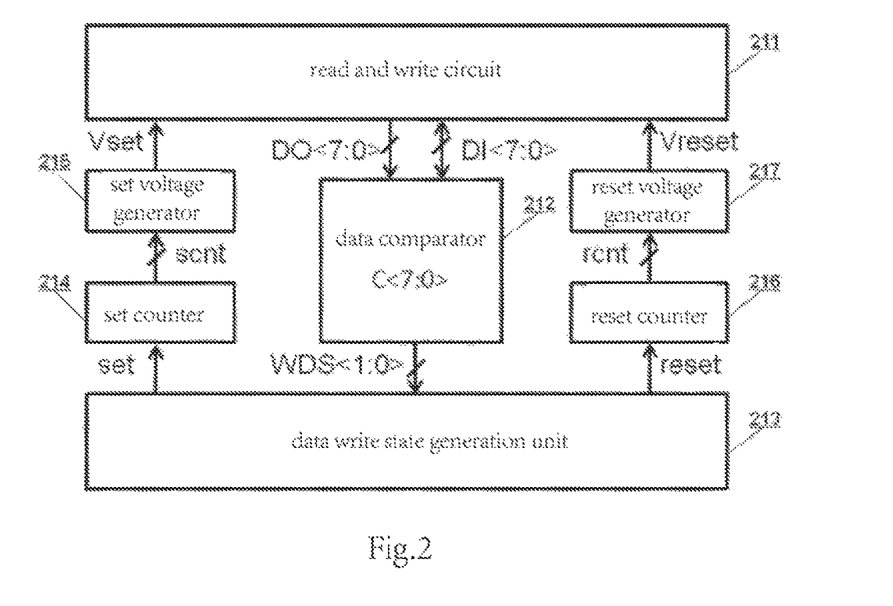
FIG. 2 is a schematic block diagram of circuit principle of a storage array programming device for a resistive random access memory according to one embodiment of the present invention.

FIG. 2 is a schematic block diagram of circuit principle of a storage array programming device for a resistive random access memory according to one embodiment of the present invention.

As shown in FIG. 2, the programming device comprises a read and write circuit 211, a data comparison circuit 212, a data write state generation unit (or referred to as "state machine") 213, a set-counter 214, a set voltage generator 215, a reset-counter 216 and a reset voltage generator 217. DI<7:0> is 8-bit data input; DO<7:0> is 8-bit data output; C<7:0> is 8-bit data comparison result; WDS<1:0> is 2-bit data write state; Set is set enable signal; Reset is reset enable signal; scnt is set counter output; rcnt is reset counter output; Vset is bit line set voltage; and Vreset is source line reset voltage.

Figure 3:
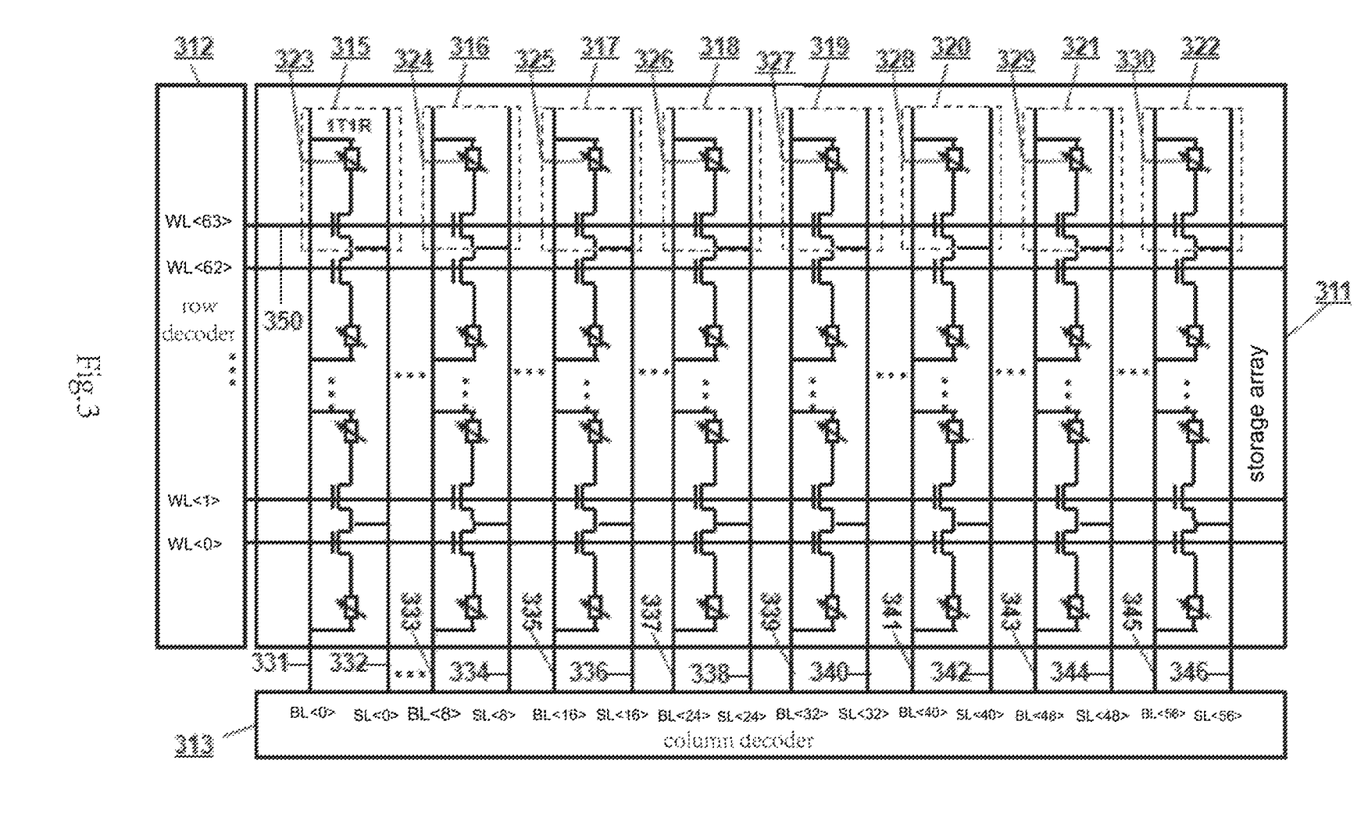
FIG. 3 is a schematic diagram of a storage array based on the 1T1R storage unit according to one embodiment of the present invention.
Figure 4:
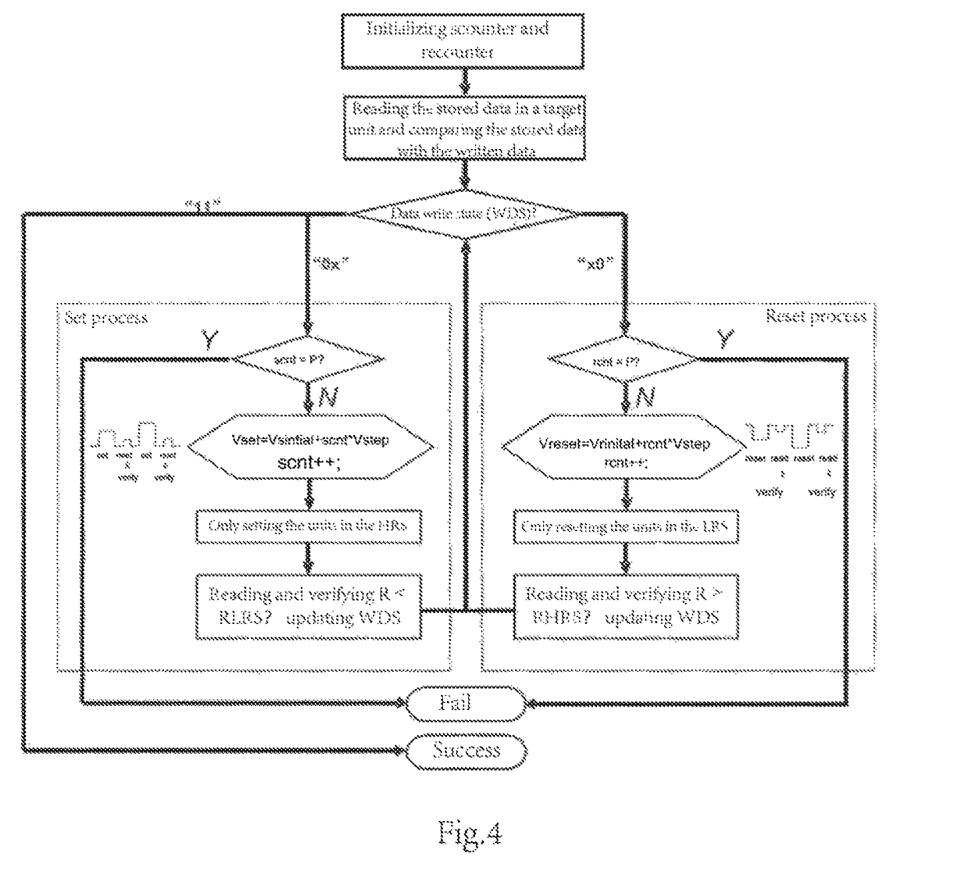
FIG. 4 is a flow block diagram of a storage array programming method for a resistive random access memory according to one embodiment of the present invention.

FIG. 3 is a schematic diagram of a storage array based on 1T1R storage unit according to one embodiment of the present invention. As shown in FIG. 3, the storage array comprises a 64×64 storage array 311, a row decoder 312 and a column decoder 313. FIG. 4 is a flow block diagram of a storage array programming method for a resistive random access memory according to one embodiment of the present invention. The programming method of the present invention will be described in detail below with reference to the storage array of FIG. 3.

Assuming it is desirable to perform writing simultaneously for eight units, i.e. column 0 unit 315, column 8 unit 316, column 16 unit 317, column 24 unit 318, column 32 unit 319, column 40 unit 320, column 48 unit 321 and column 56 unit 322 in row 63 in the storage array 311, if the currently stored value in the eight units before writing is DO[7:0]="10010011" (from left to right) and the value to be written is DI[7:0]="00011101", the writing steps can be as follows:

1. A set-counter 214 and a reset-counter 215 are initialized, such that both of scnt and rcnt are equal to 0, and predefining P=16, i.e. predefining that the number of maximum voltage pulse allowed to be applied per writing is 16.
2. A read and write circuit 211 reads the stored value DO[7:0]="10010011" in a target unit. A data comparison circuit 212 compares DO[7:0] with the value to be written DI[7:0]="00011101", and generates and registers the comparison result C[i]=~(DO[i] ^DI[i]), C[i]= "0" indicates that the value in bit i is inconsistent with the value to be written, C[i]="1" indicates that the value in bit i is consistent with the value to be written. In this example, C[7:0] is equal to "01110001". The data write state WDS[1:0] is generated according to C[i], wherein WDS[1]=&(~DI[i]|C[i]), indicates whether "1"s to be written are all consistent with the target unit data; WDS[0]=&(DI[i] H C[i]), representing whether "0"s to be written are all consistent with the target unit data. In this example, WDS[1:0]="00", representing that both "0"s and "1"s to be written are not all consistent with the target unit data.

3. A data write state generation unit 213 enables a set operation according to WDS[1:0]="00" output by the data comparison circuit 212. In addition, as can be known from Table 1, when writing operation is performed on multiple 1T1R units in the same row, as the word line voltage required by set operation differs from that required by reset operation, set and reset operations cannot be performed simultaneously and thus must be performed in two steps. In this example, assuming that a set operation is performed first:

3a. Determining scnt=0≠P; a set voltage generator 215 outputs a new bit line set voltage Vset=Vsinitial+(scnt*Vstep) based on the scnt value of the set counter 214; and subsequently the set counter 214 outputs value scnt=0+1=1;

3b. Since DI[4]=DI[3]=DI[2]=DI[0]="1" and C[4]=C[0]="1", C[3]=C[2]="0", in the units to which "1"s are to be written, the fourth and zeroth bits are consistent bits, and the third and the second bits are inconsistent bits; thus, only 1T1R units 319 and 320 corresponding to the third and the second bits are written as "1"s; in the set operation, the read and write circuit 211 connects word line 350 to Vwl_set, and the forward Vset is applied between bit line 339 and source line 340 and between bit line 341 and source line 342, respectively;

3c. The read and write circuit 211 reads the two units 319 and 320 to verify whether the resistance R of resistive units 327 and 328 is respectively smaller than $R_{LRS}$, wherein $R_{LRS}$ is a low resistance critical value; the data write state is updated according to the comparison result, if R is smaller than $R_{LRS}$, the WDS is updated to change to "1x" (x indicates "0" or "1"), indicating that "1"s to be written are all consistent with the target unit data, and if not, returning to a set operation to start a cycle; if the resistive unit 327 in column 32 changes from a high resistance state to a low resistance state and the resistive unit 328 in the column 40 is still in the high resistance, it is shown that the writing of "1" to the unit 319 in column 32 succeeds, and the writing of "1" to the unit 320 in column 40 fails;

3d. The data write state generation unit 213 updates the data write state according to the comparison result; if WDS is still "00", returning to (1); the set voltage generator 215 outputs Vset=Vsinitial+(scnt*Vstep) based on the scnt value of the set counter 214 to raise the pulse height of the applied voltage; the resistive unit 328 in column 40 is set again and read by the read and write circuit 211, and if, when scnt<P, the writing of "1" to the unit 320 in column 40 succeeds, WDS is updated to "10" by the data write state generation unit 213, a reset process will proceed, otherwise the programming fails.

4. If WDS[1:0] is updated to "10", the data write state generation unit 213 enables the reset process:

4a. Determining rcnt=0≠P, a reset voltage generator 217 outputs Vreset=Vrinitial+(rcnt*Vstep) based on the rcnt value of the reset counter 216 to obtain a new source line reset voltage, and the reset counter 216 outputs the value rcnt=0+1=1;

4b. Since D1[7]=DI[6]=DI[5]=DI[1]="0" and C[6]=C[5]="1", C[7]=C[1]="0", in the units to which "0"s are to be written, the sixth bit and the fifth bit are consistent bits and the seventh bit and the first bit are inconsistent bits, and thus only the unit 315 in column 0 and the unit 321 in column 48 of the 1T1R unit corresponding to the seventh and the first bits are written as "0"; in the reset operation, the read and write circuit 211 connects word line 350 to Vwl_reset, and the the reverse Vreset is applied between bit line 331 and source line 332 and between bit line 343 and source line 344, respectively;

4c. The read and write circuit 211 reads two units, i.e. the unit 315 in column 0 and the unit 321 in column 48, to verify whether the resistance R of resistive units 323 and 329 is respectively greater than $R_{HRS}$, wherein $R_{HRS}$ is a high resistance critical value; the data write state is updated by the data state generation unit 213 according to the comparison result, if R is greater than $R_{HRS}$, WDS is updated to "x1" (x indicates "0" or "1"), indicating that "0"s to be written are all consistent with the target unit data, and if not, returning to a reset process to start a cycle; if the resistive unit 323 in column 0 changes from a low resistance state to a high resistance state and the resistive unit 329 in the column 48 is still in the low resistance, it is shown that the writing of "0" to the unit 315 in column 0 succeeds, and the writing of "0" to the unit 321 in column 48 fails;

4d. The data write state generation unit 213 updates the data write state according to the comparison result; if WDS is still "10", returning to (1), the reset voltage generator 217 outputs Vreset=Vrinitial+(rcnt*Vstep) based on the rcnt value of the reset counter 216 to raise the voltage pulse height; the resistive unit 329 in column 48 is reset again by the read and write circuit 211, if, when rcounter<P, the writing of "0" to the unit 321 in column 48 succeeds, WDS is updated to "11" by the read and write circuit 211, reset process will proceed, otherwise the programming fails.

It is easily appreciated by those skilled in the art that the above description is merely illustration of the embodiments of the present invention by way of example, and is not intended to limit the present invention. Any modifications and equivalent alternatives can be made to the present invention within the sprit and principle of the present invention. These improvements all should be understood as falling within the scope of the present invention.

What is claimed is:

1. A storage array programming device for a resistive random access memory, the resistive random access memory comprising a storage array, the storage array comprising a group of storage units to which data is to be written, characterized in that, the storage array programming device comprising:

a read and write circuit for reading the currently stored data in the group of storage units;

a data comparator for comparing bit by bit the currently stored data with the data to be written to determine whether the currently stored data are consistent with the data to be written;

a checking unit for checking whether any storage unit having a write failure exists during the set operation performed by a set module or the reset operation performed by a reset module, and if so, then repeating the reset operation or the set operation until the writing is completed;

a data write state generation unit, which generates the data write state according to the comparison result of the data comparator;

the reset module, which performs a reset operation only on the storage units to be reset where the currently stored data are inconsistent with the data to be written according to the data write state; and the set module, which performs a set operation only on the storage units to be set where the currently stored data are inconsistent with the data to be written according to the data write state.

2. A storage array programming device for a resistive random access memory according to claim 1, wherein there are four data write states, to respectively indicate whether "0" bits in the data to be written are consistent with corresponding bits in the currently stored data and whether "1" bits in the data to be written are consistent with corresponding bits in the currently stored data.

3. A storage array programming device for a resistive random access memory according to claim 1, wherein the reset module comprises:

a reset-counter for counting the number of voltage pulses applied during a reset operation rcnt, rcnt being increased by 1 per repetition of the reset operation, wherein $0 \leq rcnt \leq P-1$, P represents a predefined maximum number of voltage pulses allowed to be applied; and a reset voltage generator for generating a source line reset voltage Vreset, Vreset=Vrinitial+(rcnt*Vstep), wherein Vrinitial is an initial reset voltage, and Vstep is a step voltage.

4. A storage array programming device for a resistive random access memory according to claim 1, wherein the set module comprises:

a set-counter for counting the number of voltage pulses applied during a set operation scnt, scnt being increased by 1 per repetition of the set operation, wherein $0 \leq scnt \leq P-1$, P represents a predefined maximum number of voltage pulses allowed to be applied; and a set voltage generator for generating a bit line set voltage Vset, Vset=Vsinitial+(scnt*Vstep), wherein Vsinitial is an initial set voltage, and Vstep is a step voltage.

5. A storage array programming device for a resistive random access memory according to claim 1, wherein the read and write circuit is further used for, after the reset operation, reading the reset storage units to verify whether the resistance of the storage units R is greater than a high resistance critical value $R_{HRS}$, and the read and write circuit is further used for, after the set operation, reading the set storage units to verify whether the resistance of the storage units R is smaller than a low resistance critical value $R_{LRS}$.

* * * * *